(12) United States Patent
Goley et al.

(10) Patent No.: US 12,672,362 B2
(45) Date of Patent: Jun. 30, 2026

(54) AVALANCHE PHOTODIODES

(71) Applicant: Georgia Tech Research Corporation, Atlanta, GA (US)

(72) Inventors: Patrick Stephen Goley, Atlanta, GA (US); John D. Cressler, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 954 days.

(21) Appl. No.: 17/822,451

(22) Filed: Aug. 26, 2022

(65) Prior Publication Data

US 2024/0006548 A1 Jan. 4, 2024

Related U.S. Application Data

(60) Provisional application No. 63/365,504, filed on May 31, 2022.

(51) Int. Cl.
| | |
|---|---|
| *H10F 30/225* | (2025.01) |
| *H10F 30/222* | (2025.01) |
| *H10F 39/10* | (2025.01) |
| *H10F 71/00* | (2025.01) |
| *H10F 77/122* | (2025.01) |
| *H10F 77/14* | (2025.01) |

(52) U.S. Cl.
CPC ......... *H10F 30/225* (2025.01); *H10F 30/222* (2025.01); *H10F 39/103* (2025.01); *H10F 71/121* (2025.01); *H10F 77/122* (2025.01); *H10F 77/148* (2025.01)

(58) Field of Classification Search
CPC .... H10F 30/222; H10F 30/225; H10F 39/103; H10F 71/121; H10F 77/122; H10F 77/148
See application file for complete search history.

(56) References Cited

U.S. PATENT DOCUMENTS

| | | | | |
|---|---|---|---|---|
| 2001/0017786 A1* | 8/2001 | Woodward | ............ | H10F 30/225 365/120 |
| 2005/0118743 A1* | 6/2005 | Maeng | ................... | H10F 30/221 438/57 |
| 2010/0245809 A1* | 9/2010 | Andreou | ............... | H10F 39/802 257/292 |
| 2011/0241149 A1* | 10/2011 | Mazzillo | ............... | H10F 77/206 257/438 |

FOREIGN PATENT DOCUMENTS

| | | | | | |
|---|---|---|---|---|---|
| CN | 211907450 U | * | 11/2020 | | |
| CN | 212907740 U | * | 4/2021 | | |
| CN | 115274895 A | * | 11/2022 | ............. | H10F 77/14 |

* cited by examiner

*Primary Examiner* — Yara B Green
*Assistant Examiner* — Christopher M Roland
(74) *Attorney, Agent, or Firm* — TROUTMAN PEPPER LOCKE LLP; Ryan A. Schneider; Nicholas H. Doss

(57) ABSTRACT

An exemplary embodiment of the present disclosure provides an avalanche photodiode (APD), comprising: a p-doped substrate; a first n-doped region; an n-doped epitaxial region; a plurality of n-doped wells; and a first p-doped region. The first n-doped region can be positioned above at least a portion of the p-doped substrate. The n-doped epitaxial region can be positioned above at least a portion of the first n-doped region. The plurality of n-doped wells can be positioned within the first n-doped epitaxial region. The first p-doped region can be positioned above the n-doped epitaxial region and the plurality of n-doped wells.

19 Claims, 7 Drawing Sheets

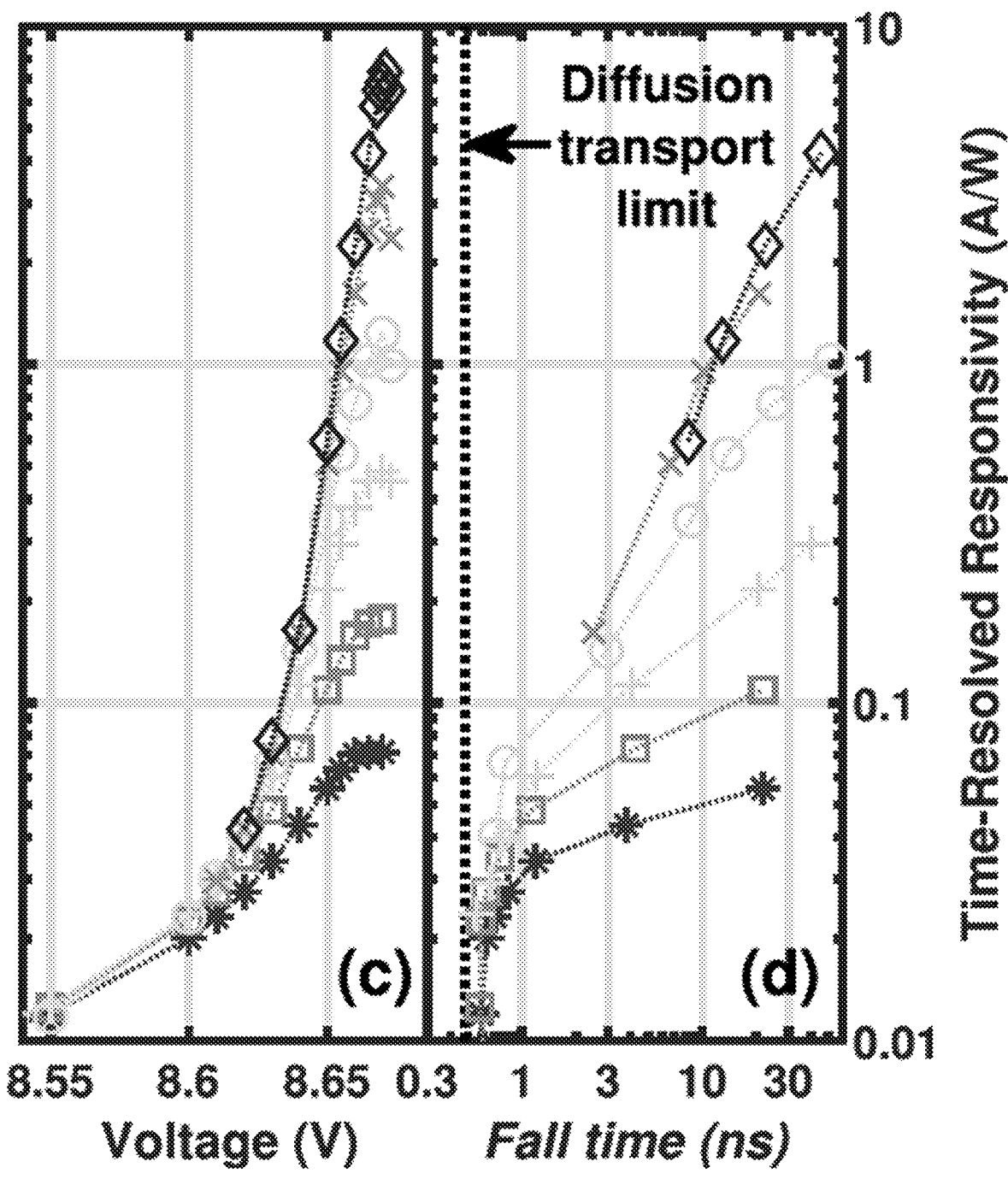
FIG. 4C          FIG. 4D

AVALANCHE PHOTODIODES

CROSS-REFERENCE TO RELATED APPLICATIONS

This application claims the benefit of U.S. Provisional Application Ser. No. 63/365,504, filed on 31 May 2022, which is incorporated herein by reference in its entirety as if fully set forth below.

FIELD OF THE DISCLOSURE

The various embodiments of the present disclosure relate generally to semiconductor devices, and more particularly to avalanche photodiodes.

BACKGROUND

Avalanche photodiode (APD) designs compatible with standard CMOS and BiCMOS process technologies are highly desired because they enable down-scaling of size, weight, power, and cost of optical receive sub-systems. Such silicon (Si)-integrated APDs are typically fabricated directly, monolithically, alongside conventional Si electronics in high-volume commercial foundries. This can be achieved by restricting the design of the APD to consist solely of preexisting process layers and dopant implants already present in a given CMOS or BiCMOS platform, and by ensuring conformity to foundry design rules. Of course, when design freedom is constrained in this way, the resulting APD is unlikely to compete on raw performance with their discrete APD counterparts. However, the ability to design a full optical receive sub-system, with all requisite supporting digital and analog electronics, including transimpedance and limiting amplifiers, and decision and clock recovery circuits, on a single chip in a high-volume, high-yield, low-cost Si foundry remains compelling. Research on Si-integrated APDs has been advancing steadily for two decades.

Conventional techniques have focused on optical wavelengths of 850 nm and below. As the wavelength approaches the silicon band-edge, optical absorption drops off precipitously. The absorption depth at 850 nm is 19 μm, while at 1064 nm its 1 mm, which would nearly seem to rule-out the possibility of practical high-speed Si-integrated APD for 1064 nm light. While discrete Si APDs designed for longer wavelengths are free to engineer depletion regions of 100 μm or longer, in standard silicon processing, in which typically only the top 2 μm can be engineered, this is not possible. Therefore, to eliminate long diffusion tails and improve APD bandwidth in integrated devices, screening junctions are often placed below the primary junction. This approach has proven successful to improve the speed of devices at 850 nm. However, this clearly comes at a direct cost of responsivity, since screened carriers do not contribute to the primary photocurrent, although they may still be monitored as a low-bandwidth average power measurement, or beacon signal. For a screening junction placed at a depth of 2 μm, a Si-integrated APD might ideally collect 100% of carriers generated in the top 1.5 m of silicon. This factor alone limits the unmultiplied quantum efficiency and responsivity to merely 0.15% and 1.3 mA/W, respectively, at 1064 nm. Reflection and absorption losses in back-end-of-line (BEOL) layers will inevitably erode those figures further. Therefore, it is desirable for any proposed high-speed Si-integrated APD designed for operation near the silicon band edge to be capable of high avalanche gain, and since both noise and avalanche duration (more commonly referred to as "build-up time") scale with gain, it is desirable for the larger system into which that APD is placed to exploit that gain judiciously.

As challenging as it is for silicon receivers, longer wavelengths like 1064 nm remain attractive for optical systems due to reduced Rayleigh and Mie scattering, less background sunlight, and improved eye safety, compared to 850 nm light. Many prospective applications for Si-integrated APDs are constrained by eye safety requirements due to their use in public spaces. Examples include: laser range finding, automotive LIDAR, 3D time-of-flight imaging, remote sensing, and free-space optical communication. Conveniently, 1064 nm is also centered in the second atmospheric optical transmission window.

Accordingly, there is a need for improved APDs that address one or more of these concerns.

BRIEF SUMMARY

An exemplary embodiment of the present disclosure provides an avalanche photodiode (APD), comprising: a p-doped substrate; a first n-doped region; an n-doped epitaxial region; a plurality of n-doped wells; and a first p-doped region. The first n-doped region can be positioned above at least a portion of the p-doped substrate. The n-doped epitaxial region can be positioned above at least a portion of the first n-doped region. The plurality of n-doped wells can be positioned within the first n-doped epitaxial region. The first p-doped region can be positioned above the n-doped epitaxial region and the plurality of n-doped wells.

In any of the embodiments disclosed herein, the APD can further comprise a plurality of shallow trench isolations positioned beneath the first p-doped region and extending into at least a portion of n-doped epitaxial region.

In any of the embodiments disclosed herein, the p-doped substrate can be a p-doped silicon substrate.

In any of the embodiments disclosed herein, the first n-doped region can have a higher doping concentration than a doping concentration of the n-doped epitaxial region.

In any of the embodiments disclosed herein, the first n-doped region can have a higher doping concentration than a doping concentration of the plurality of n-doped wells.

In any of the embodiments disclosed herein, the first p-doped region can have a higher doping concentration than a doping concentration of the p-doped substrate.

In any of the embodiments disclosed herein, the first p-doped region can comprise SiGe.

In any of the embodiments disclosed herein, the first p-doped region can form the anode of the APD.

In any of the embodiments disclosed herein, the first n-doped region can form at least a portion of the cathode of the photodiode.

In any of the embodiments disclosed herein, the APD can further comprise a second p-doped region positioned above at least a portion of the p-doped substrate, and the second p-doped region can extend around a perimeter of at least a portion of the first n-doped region and the n-doped epitaxial region.

In any of the embodiments disclosed herein, the second p-doped region can have a higher doping concentration than a doping concentration of the p-type substrate.

In any of the embodiments disclosed herein, the second p-doped region can have a higher doping concentration than a doping concentration of the first p-type region.

In any of the embodiments disclosed herein, the APD can further comprise a second n-doped region positioned above at least a portion of the first n-doped region, the second n-doped region can extend around a perimeter of at least a portion of the n-doped epitaxial region, and the second p-doped region can extends around a perimeter of at least a portion of the second n-doped region.

In any of the embodiments disclosed herein, the APD can further comprise a third p-doped region positioned above at least a portion of the second p-doped region, and the third p-doped region can have a higher doping concentration than a doping concentration of the second p-doped region.

In any of the embodiments disclosed herein, the plurality of n-doped wells can extend along a length of the n-doped epitaxial region.

In any of the embodiments disclosed herein, the APD can achieve a maximum responsivity-bandwidth product of 25-35 A/W×MHz at wavelengths between 1000-1100 nm.

In any of the embodiments disclosed herein, the p-doped substrate, the first n-doped region, the n-doped epitaxial region, and the plurality of n-doped wells can each comprise silicon and the first p-doped region can comprise SiGe.

In any of the embodiments disclosed herein, the first n-doped region, the n-doped epitaxial region, the plurality of n-doped wells, and the first p-doped region can have a combined thickness of less than 2 microns.

These and other aspects of the present disclosure are described in the Detailed Description below and the accompanying drawings. Other aspects and features of embodiments will become apparent to those of ordinary skill in the art upon reviewing the following description of specific, exemplary embodiments in concert with the drawings. While features of the present disclosure may be discussed relative to certain embodiments and figures, all embodiments of the present disclosure can include one or more of the features discussed herein. Further, while one or more embodiments may be discussed as having certain advantageous features, one or more of such features may also be used with the various embodiments discussed herein. In similar fashion, while exemplary embodiments may be discussed below as device, system, or method embodiments, it is to be understood that such exemplary embodiments can be implemented in various devices, systems, and methods of the present disclosure.

BRIEF DESCRIPTION OF THE DRAWINGS

The following detailed description of specific embodiments of the disclosure will be better understood when read in conjunction with the appended drawings. For the purpose of illustrating the disclosure, specific embodiments are shown in the drawings. It should be understood, however, that the disclosure is not limited to the precise arrangements and instrumentalities of the embodiments shown in the drawings.

FIG. 4C provides time-resolved responsivity of the photocurrent pulses. FIG. 4D combines the plots in FIGS. 4B and 4C to yield a mapping of responsivity to $t_{fall}$, showing the impact of avalanche duration.

DETAILED DESCRIPTION

To facilitate an understanding of the principles and features of the present disclosure, various illustrative embodiments are explained below. The components, steps, and materials described hereinafter as making up various elements of the embodiments disclosed herein are intended to be illustrative and not restrictive. Many suitable components, steps, and materials that would perform the same or similar functions as the components, steps, and materials described herein are intended to be embraced within the scope of the disclosure. Such other components, steps, and materials not described herein can include, but are not limited to, similar components or steps that are developed after development of the embodiments disclosed herein.

The present disclosure provides the first demonstration of a high-gain Si-integrated APD which uses the strained silicon-germanium (SiGe) base of a heterojunction bipolar transistor (HBT) as its anode, and the first detailed investigation of an Si-integrated APD for use above 1 μm.

Figure 1:
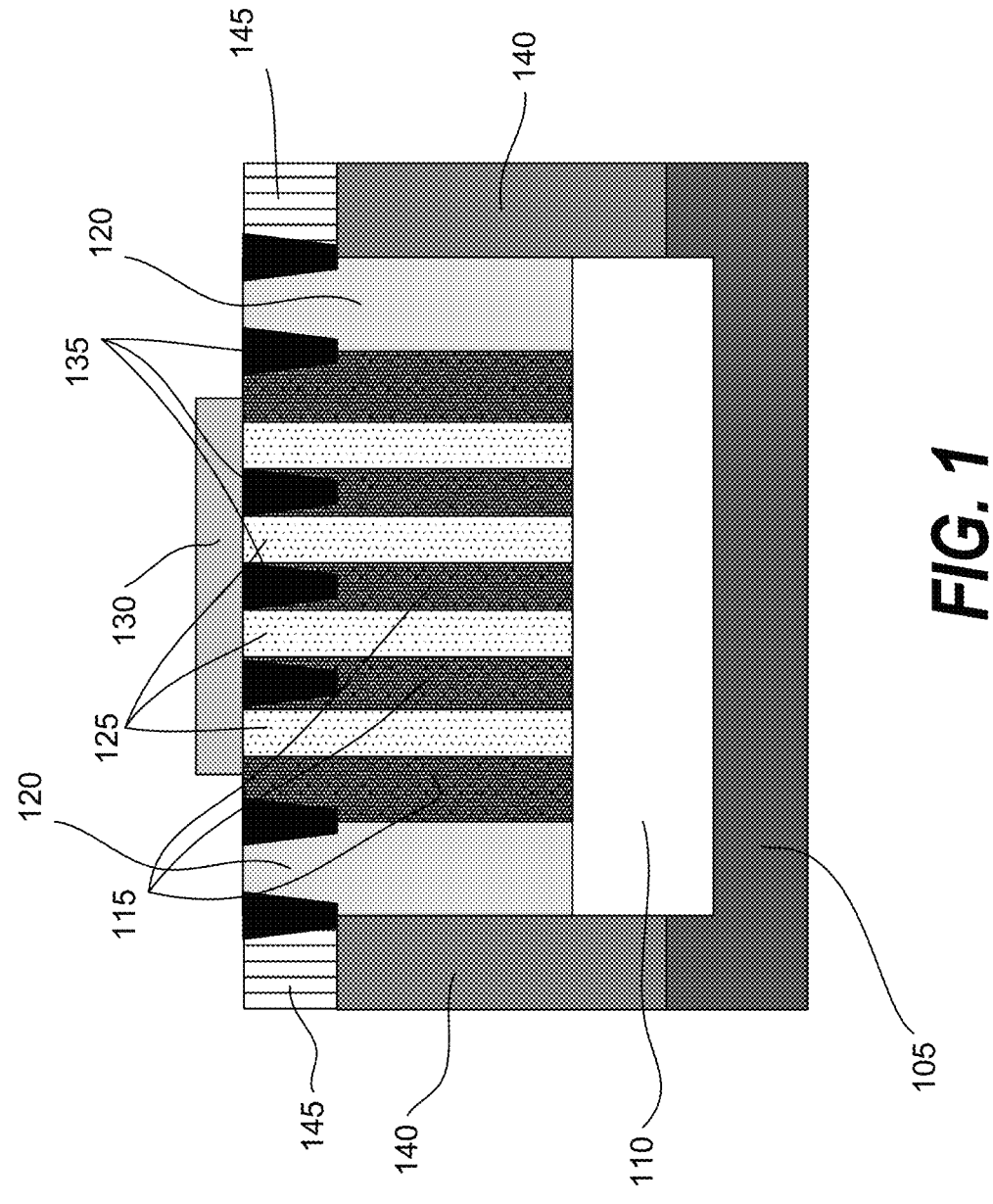
FIG. 1 provides a cross-sectional view of an avalanche photodiode (APD), in accordance with an exemplary embodiment of the present disclosure.
Figures 2A, 2B:
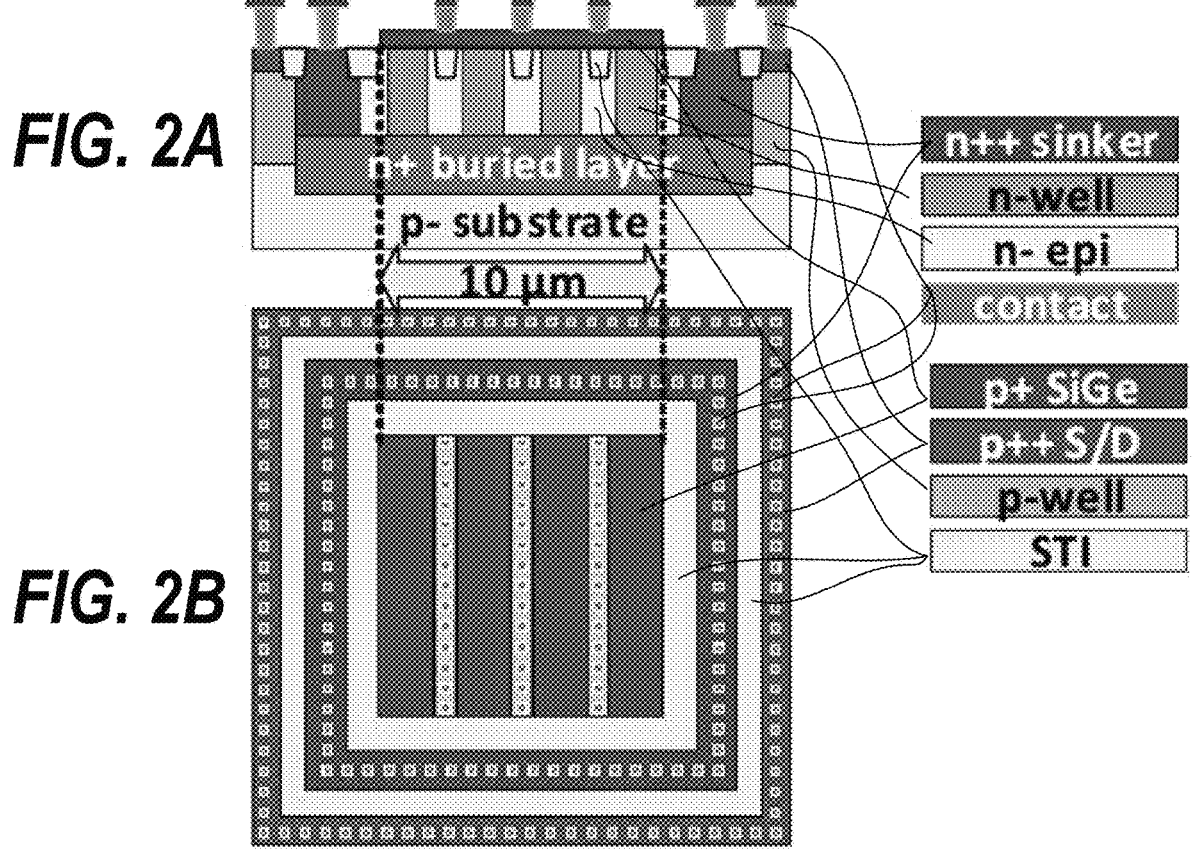
FIGS. 2A-B provide a cross-sectional and top-down views, respectively, of an APD, in accordance with an exemplary embodiment of the present disclosure.

As shown in FIGS. 1 & 2A-B, an exemplary embodiment of the present disclosure provides an avalanche photodiode (APD). The APD can comprise a substrate 105, which can be p-doped. In some embodiments, the p-doped substrate 105 can be a p-doped silicon substrate 105.

A shown in FIG. 1, a first n-doped region 110 can be positioned above at least a portion of the substrate 105. The first n-doped region 110 can form at least a portion of the cathode of the photodiode. In some embodiments, the first n-doped region 110 can be made of silicon.

As also shown in FIG. 1, an n-doped epitaxial region 115 can be positioned above at least a portion of the first n-doped region 110. In some embodiments, the n-doped epitaxial region 115 can be epitaxially grown on the first n-doped region 110. In some embodiments, the n-doped epitaxial region 115 can be made of silicon.

As also shown in FIG. 1, a plurality of n-doped wells 125 can be positioned within the n-doped epitaxial region 115. In some embodiments, the plurality of n-doped wells 125 can extend along a length of the n-doped epitaxial region 115. In some embodiments, as shown in FIG. 1, the plurality of n-doped wells 125, can extend from a top surface of the n-doped epitaxial region 115 to a bottom surface of the n-doped epitaxial region 115 adjacent the first n-doped region 110. In some embodiments, the plurality of n-doped wells 125 can be made of silicon.

As also shown in FIG. 1, a first p-doped region 130 can be positioned above the n-doped epitaxial region 115 and the plurality of n-doped wells 125. In some embodiments, the first p-doped region 130 can be made of SiGe. The first p-doped region 130 can form at least a portion of the anode of the APD. The APD can be configured to receive light from an external source through the first p-doped region 130.

As also shown in FIG. 1, the APD can further comprise a plurality of shallow trench isolations (STIs) 135. The STIs 135 can be positioned beneath the first p-doped region 130 and can extend, at least partially, into at least a portion of n-doped epitaxial region 115. In some embodiments, as shown in FIG. 1, the STIs 135 can be located in the n-doped epitaxial region 115 between the plurality of n-doped wells 125.

As also shown in FIG. 1, the APD can further comprise a second p-doped region 140 positioned above at least a portion of the p-doped substrate 105. As shown in FIG. 1, the second p-doped region 140 can extend around a perimeter of at least a portion of the first n-doped region 110 and the n-doped epitaxial region 115. In some embodiments, the second p-doped region 140 can be made of silicon.

As also shown in FIG. 1, the APD can further comprise a second n-doped region 120 positioned above at least a portion of the first n-doped region 110. As shown in FIG. 1, the second n-doped region 120 can extend around a perimeter of at least a portion of the n-doped epitaxial region 115. As also shown in FIG. 1, the second p-doped region 140 can extend around a perimeter of at least a portion of the second n-doped region 120. In some embodiments, the second n-doped region 120 can be made of silicon.

As also shown in FIG. 1, the APD can further comprise a third p-doped region 145 positioned above at least a portion of the second p-doped region 140. In some embodiments, the third p-doped region 145 can be made of silicon.

The doping concentrations of the various p- and n-doped regions of the APD can vary in accordance with various embodiments. In some embodiments, the first n-doped region 110 can have a higher doping concentration than a doping concentration of the n-doped epitaxial region 115. In some embodiments, the first n-doped region 110 can have a higher doping concentration than a doping concentration of the plurality of n-doped wells 125. In some embodiments, the first p-doped region 130 can have a higher doping concentration than a doping concentration of the p-doped substrate 105. In some embodiments, the second p-doped region 140 can have a higher doping concentration than a doping concentration of the p-type substrate 105. In some embodiments, the second p-doped region 140 can have a higher doping concentration than a doping concentration of the first p-type region. The third p-doped region 145 can have a higher doping concentration than a doping concentration of the second p-doped region 140.

As discussed above, APDs disclosed herein can achieve higher responsivity at higher wavelengths, e.g., greater than 1 micron, as compared to many conventional APDs. In some embodiments, the APDs disclosed herein can achieve sufficient responsivity at wavelengths over micron. For example, in some embodiments, the APD can achieves a maximum responsivity-bandwidth product of up to 35 A/W× MHz at wavelengths over 1 micron, e.g., between 1000-1100 nm. In some embodiments, the APD can achieves a maximum responsivity-bandwidth product of at least 25 A/W×MHz at wavelengths between 1000-1100 nm. In some embodiments, the APD can achieves a maximum responsivity-bandwidth product of between 25 and 35 A/W×MHz at wavelengths between 1000-1100 nm. Additionally, in these embodiments, the maximum responsivity-bandwidth product can be achieved without the use of an anti-reflective coating.

The APDs disclosed herein can also achieve high functionality while maintaining small sizes/thicknesses. For example, in some embodiments the first n-doped region 110, the n-doped epitaxial region 115, the plurality of n-doped wells 125, and the first p-doped region 130 can have a combined thickness of less than 5 microns, less than 4 microns, less than 3 microns, or less than 2 microns. In some embodiments, the first n-doped region 110, the n-doped epitaxial region 115, the plurality of n-doped wells 125, and the first p-doped region 130 can have a combined thickness between 1 and 5 microns, between 1 and 4 microns, between 1 and 3 microns, between 1.5 and 2.5 microns, or between 1.5 and 2 microns.

The following example further illustrate aspects of the present disclosure. However, the example is in no way a limitation of the teachings or disclosure of the present disclosure as set forth herein.

EXAMPLE

Device Structure and Operation

Figure 2C:
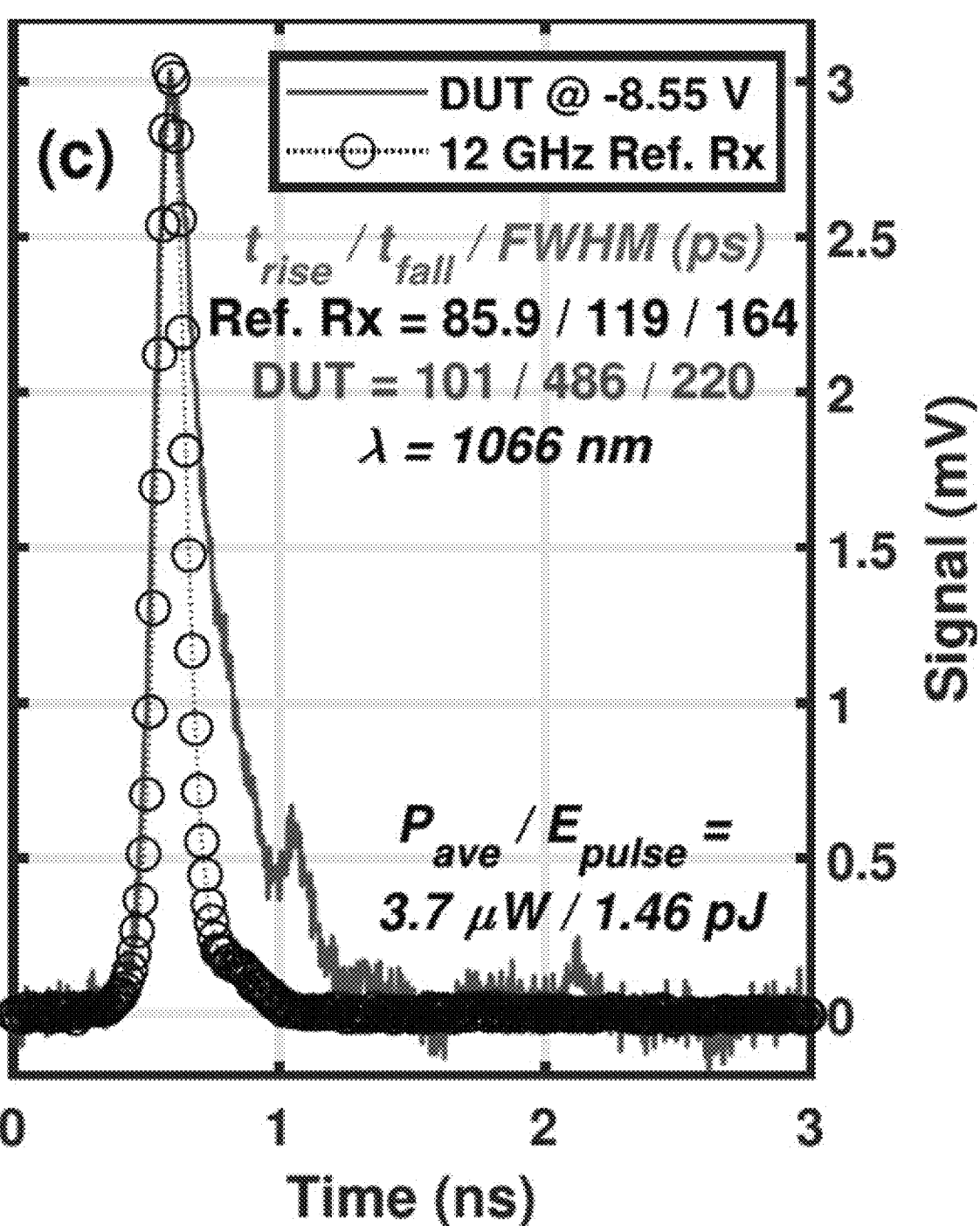
FIG. 2C provides a plot of a pulse response of the exemplary APD shown in FIGS. 2A-B at a modest bias condition where the overall responsivity is 0.012 A/W and $M_{ph}$ is 19.

An exemplary SiGe APD was fabricated in a commercial, high-performance (300 GHz fT=fMAX), high-volume, 180-nm SiGe BiCMOS technology (Tower SBC18H5) with no process changes. The design conformed to all critical foundry design rules and is shown in FIGS. 1A-B. The strained SiGe base layer of the SiGe HBT was repurposed to form the APD's anode. The improved lateral carrier mobility from the strained SiGe reduces parasitic resistance and improves the uniformity of the electric field across the $10 \times 10 \ \mu m^2$ active junction area, which can be important for high avalanche gain. Shallow trench isolations (STI) were placed locally under anode contact fingers to improve the reliability and consistency of contacting the strained SiGe layer. Three 0.8 μm wide anode contact fingers were evenly spaced over the anode, as shown in FIG. 2A, resulting in an anode finger separation of 1.9 μm. The n-doped epitaxial layer was underfilled with the n-doped well implants to form the cathode. Lateral 0.25 μm gaps of low doped n-doped epitaxial were left between the STI and n-doped wells to mitigate edge breakdown and trap-assisted-tunneling dark current at the STI sidewalls. The n++ sinker and n+ buried layer, also borrowed from the SiGe HBT, formed the cathode contact. These layers, with lower sheet resistance than the n-doped well and deep n-doped well layers, further improved uniformity of the junction electric field. The buried layer substrate junction formed the screening junction, which enclosed the primary junction, isolating it from carriers generated below an estimated depth of 1.5 μm. The cathode and substrate were grounded for all measurements, and, therefore, the screening junction operated at a constant 0 V bias condition, where its responsivity is 11.5 mA/W for the tested wavelength of 1066 nm. The depletion layer width of the primary junction at breakdown, which occurs at an anode voltage of −8.7 V, can be estimated as approximately 200-250 nm. Therefore, the n-wells may not be fully depleted and minority carrier holes can still diffuse about 1 μm to the depletion region, limiting the speed of the device. This analysis is supported by the small diffusion tail observed in the pulse response shown in FIG. 2C, were the applied bias of 8.55 V is low enough that the avalanche build-up time has not yet begun to significantly impact device speed. Estimating the 3-dB bandwidth from the fall time, $t_{fall}$, gives $(0.35/t_{fall})$ 720 MHz. Here $t_{fall}$ can be used to estimate the bandwidth, rather than $t_{rise}$, since for such short optical pulses only $t_{fall}$ contains the full diffusion tail.

Characterization and Discussion

For all optical measurements, 1066 nm light was focused onto the APD to an estimated 10 μm spot size using a 10×NIR objective. All reported optical powers, including those used to compute responsivity, represent the total power measured in free-space incident on the chip. Therefore, the reported responsivities include all reflection and absorption losses in the BEOL layers. Furthermore, no attempt was made to incorporate an anti-reflective (AR) coating. If even a modest AR coating is added, responsivity can be substantially improved relative to the values stated here.

Figures 3A, 3B:
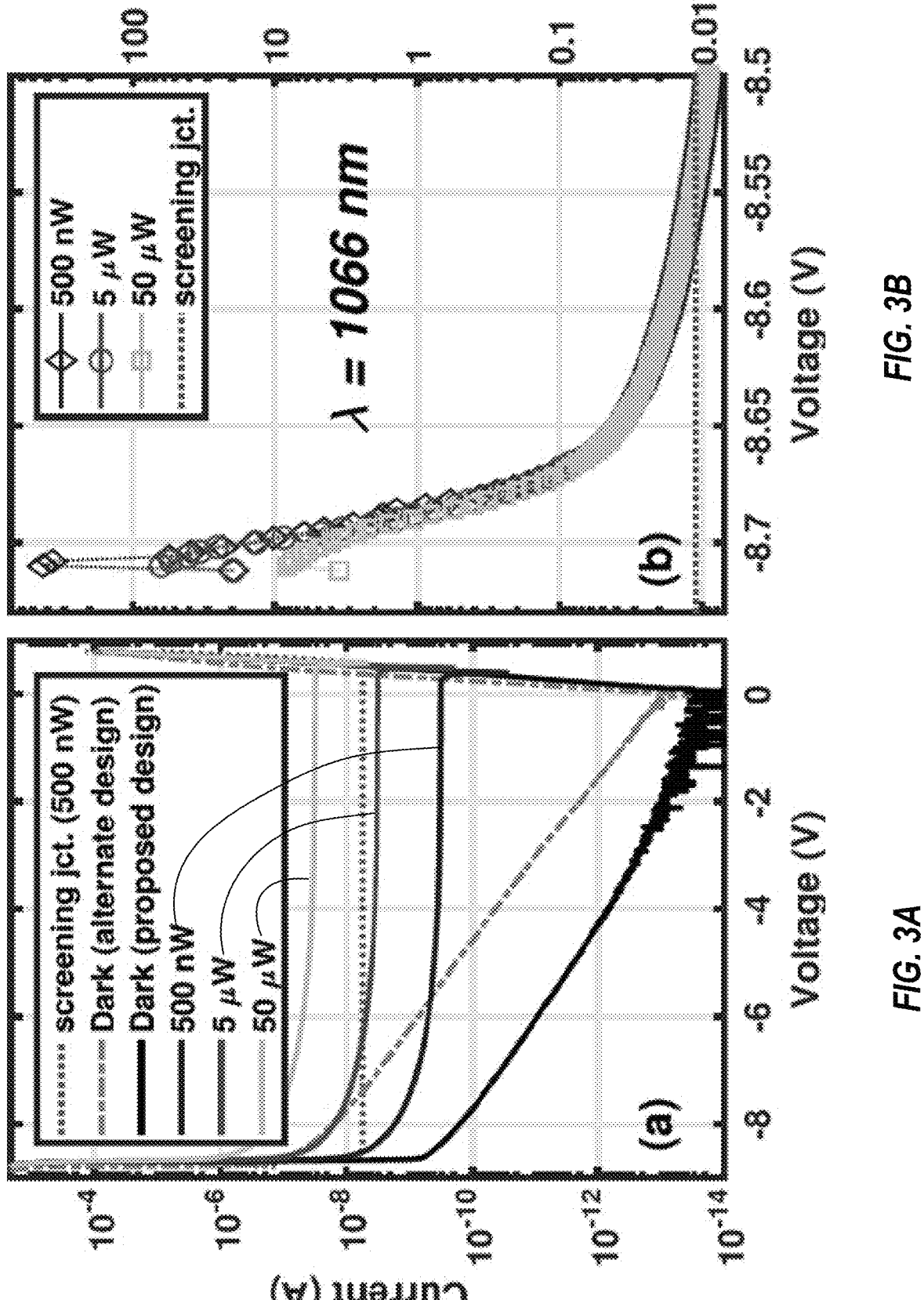
FIG. 3A provides a plot showing constant optical power and dark current-voltage characteristics for an exemplary APD of the present disclosure for 1066 nm light.
FIG. 3B provides a plot of overall responsivity of an exemplary APD of the present disclosure as a function of voltage for three different constant power levels and the screening junction.

Constant power and dark current-voltage characteristics, and overall responsivity, are shown in FIG. 3. Dark current for an alternate design in which the n-doped epitaxial layer was completely filled in with the n-doped well implants (i.e., no n-doped epitaxial around the STIs), but is otherwise identical to the design of FIG. 2A-B, exhibited elevated dark current, as shown by the dashed line of FIG. 3A. This is attributed to trap-assisted tunneling at the STI sidewalls. At 0 V the primary junction had a responsivity of 0.63 mA/W, agreeing with the introductory analysis. The primary junction begins to exceed responsivity of the screening junction at −8.54 V, where it has an avalanche multiplication gain, $M_{ph}$, of 18.5. At 10 A/W, $M_{ph}$ is 16,000. The high gain can be explained, in part, by effective edge-breakdown mitigation and good electric field uniformity across the junction area. It can be further explained by an empirical model, which states that the maximum achievable gain is:

$$(M_{ph})_{max} = \sqrt{\frac{V_B}{nI_PR}},$$

where $V_B$ is the breakdown voltage, R is the series resistance, $I_P$ is the unmultiplied photocurrent, and n is a constant depending on material, doping, and wavelength. The equation captures the intuitive principle that a lower $I_PR$ product allows an APD to be biased to higher $M_{ph}$ before a significant portion of the applied voltage is lost across parasitics. This is why $(M_{ph})_{max}$ is routinely observed to be enhanced for lower power (evident in FIG. 3). As a direct consequence, $(M_{ph})_{max}$ can also be naturally enhanced at longer wavelengths, partially offsetting weaker absorption. The form of $(M_{ph})_{max}$ indicates the enhancement can be increased as R is reduced. With its strained SiGe anode and n+ buried layer cathode contact, the exemplary SiGe APD can be designed to exploit these relationships. The gain-enhancement, however, can occur around $V=V_B$. Far from $V_B$, $M_{ph}$ can be largely independent of $I_P$ (also evident in FIG. 3).

This high gain may not be useful for practical applications due to the avalanche duration, which increases with gain (and therefore increases with voltage bias until $V_B$ is reached). To better understand the useful gain that is available for the amplification of short pulses, such as those used in many applications, pulse response was measured across a wide range of input power levels and voltage biases. For these measurements, the photocurrent can be split into its DC and highspeed components using a bias tee. The highspeed component is passed directly, without external amplification, into the 50-input impedance of a remote sampling head of a high-speed sampling oscilloscope. Time-resolved responsivity can be obtained by dividing the peak signal voltage by 50- to recover the photocurrent, and also by peak optical power of the square input pulse. These input pulses were characterized using a reference 12-GHz photo-receiver, and have a rise time, fall time, full-width-half-max (FWHM), and repetition rate of 87 ps, 240 ps, 6.51 ns, and 2.5 MHz, respectively. Pulse energy and peak power were adjusted solely using an external variable optical attenuator to preserve pulse shape. Pulse energy was monitored using a 90/10 splitter and power detector.

Figures 4A, 4B:
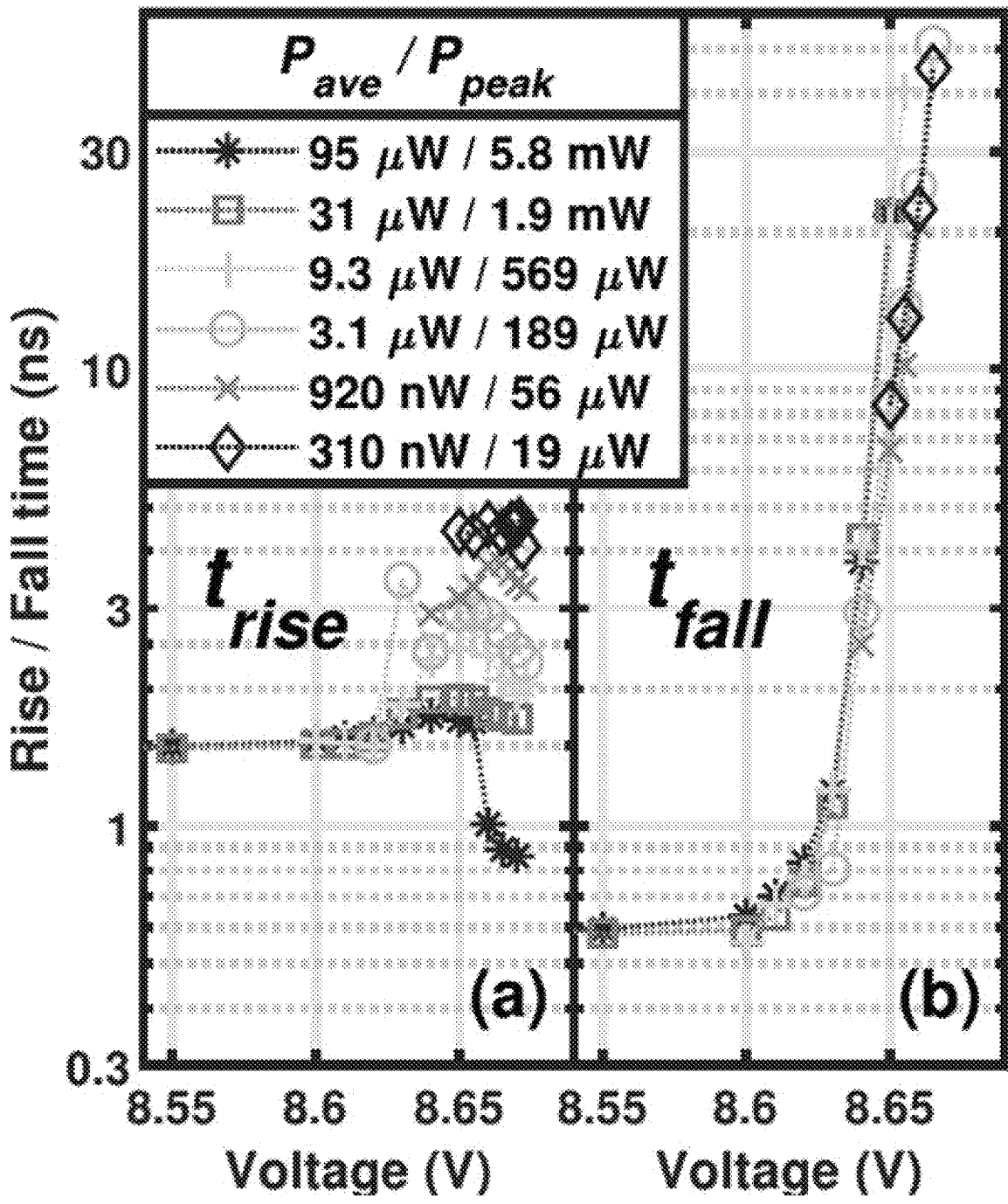
FIGS. 4A-B provides a summary of pulse response data from a 6.5 ns square optical input pulse showing $t_{rise}$ (FIG. 4A) and $t_{fall}$ (FIG. 4B) of the output photocurrent pulses for an exemplary APD of the present disclosure.
Figure 4E:
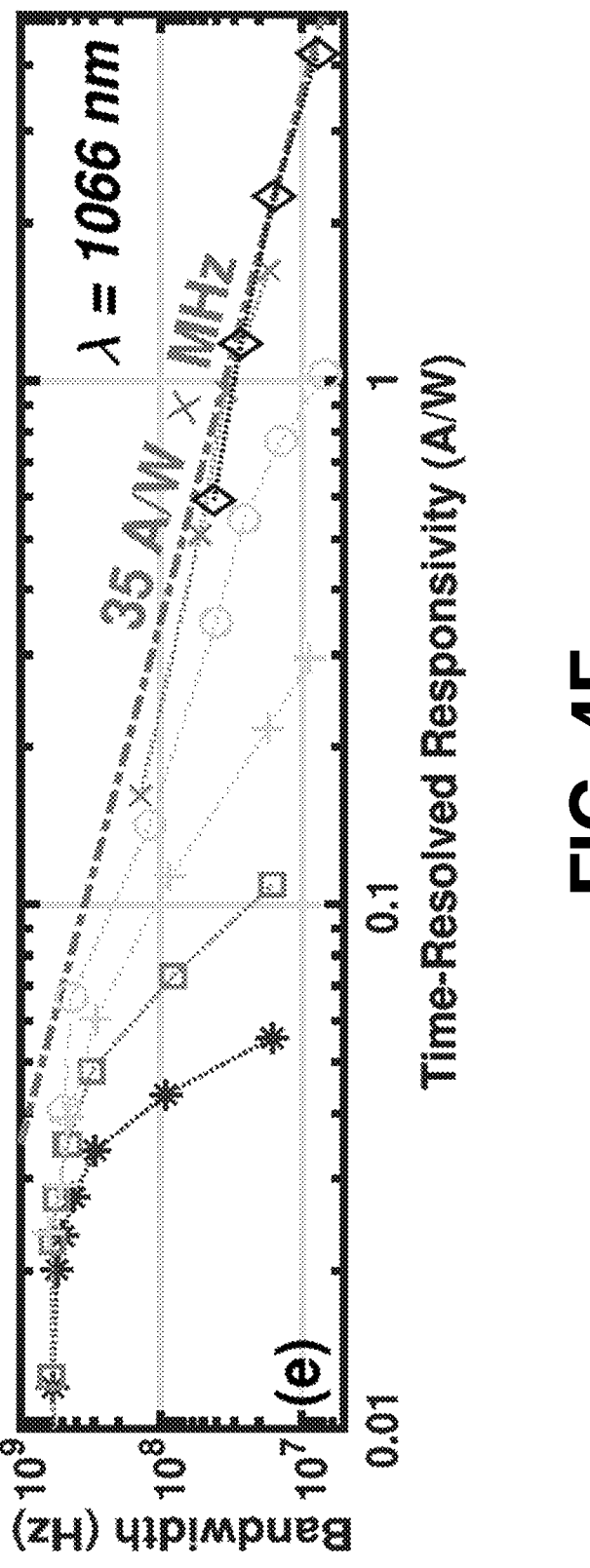
In FIG. 4E, $t_{fall}$ is used to estimate the 3-dB bandwidth, transforming (FIG. 4D) into a map of the responsivity-bandwidth tradespace.

Pulse response data are summarized in FIG. 4. FIGS. 4A-B show the bias dependence of $t_{rise}$ and $t_{fall}$ (10%/90%)

for six different power levels. At low bias, $t_{rise}$ and $t_{fall}$ can be controlled by diffusive transport, as mentioned previously. As bias is increased beyond 8.6 V, device speed can enter an avalanche-duration dominated regime. The impact of avalanche duration can be more clearly seen in $t_{fall}$, since $t_{rise}$ can be limited by the width of the input pulse. FIG. 4C shows the bias and optical power dependence of the time-resolved responsivity, which shows good agreement with the constant power measurements of FIG. 3B where power is comparable. At low bias (<8.6 V), responsivity can be largely independent of optical power. As expected from the form of $(M_{ph})_{max}$, as bias approaches the breakdown voltage, responsivity can become increasingly dependent on optical power. For lower optical power, responsivity and $M_{ph}$ can grow faster with bias due to a lower $I_PR$ product. However, as $M_{ph}$ increases for these low input power and high bias conditions, so can the avalanche duration. FIGS. 4B-C are combined together in FIG. 4D, resulting in an explicit mapping of avalanche duration to overall responsivity for different optical power levels. Alternatively, the measured $t_{fall}$ values can be used to estimate the 3-dB bandwidth, resulting in a mapping of bandwidth to overall responsivity, as shown in FIG. 4E. When optical power is high, the maximum responsivity-bandwidth product is limited by the $I_PR$ product, which represents the portion of the applied voltage lost due to parasitic resistance in the cathode and anode. Table I compares these results to other state-of-the-art Si-integrated APDs using a figure of merit (FOM) that incorporates the wavelength dependence of optical absorption.

TABLE I

| Reference $V_B$ | Technology Node | $\lambda$ $\delta_{Si}{}^a$ | R ($M_{ph}$) Bandwidth | FOM (A/W-GHz-µm) |
|---|---|---|---|---|
| Ref. 1 10.7 V | CMOS 65 nm | 850 nm 18.7 µm | 2.94 A/W (569) 3.2 GHz | 176 |
| Ref. 2 11.9 V | CMOS 180 nm | 850 nm 18.7 µm | 0.05 A/W (62.3) 8.7 GHz | 8.1 |
| Ref. 3 9.1 V | CMOS 180 nm | 830 nm 15.4 µm | 0.5 A/W (70) [c] 4.5 GHz [c] | 34.7 |
| Ref. 4 68 V | HV-CMOS 350 nm | 670 nm 4.18 µm | 20.5 A/W (50) 0.85 GHz | 72.8 |
| 22 10.0 V | CMOS 130 nm | 850 nm 18.7 µm | 0.35 A/W (28.4) 10 GHz | 65.5 |
| The Present Disclosure 8.7 V | SiGe BiCMOS 180 nm | 1066 nm 1082 µm | 0.07 A/W (111) 0.43 GHz | 32.6 |

Ref. 1: M.-J. Lee and W.-Y. Choi, "A silicon avalanche photodetector fabricated with standard CMOS technology with over 1 THz gain-bandwidth product," Opt. Express, vol. 18, no. 23, pp. 24 189-24 194, November 2010, doi: 10.1364/OE.18.024189.
Ref. 2: F.-P. Chou, C.-W. Wang, Z.-Y. Li, Y.-C. Hsieh, and Y.-M. Hsin, "Effect of deep n-well bias in an 850-nm si photodiode fabricated using the cmos process," IEEE Photonics Technology Letters, vol. 25, no. 7, pp. 659-662, 2013, doi: 10.1109/LPT.2013.2248352.
Ref. 3: K. Iiyama, T. Shimotori, R. Gyobu, T. Hishiki, and T. Marayama, "10 GHz bandwidth of Si avalanche photodiode fabricated by standard 0.18 m CMOS process," in 2014 OptoElectronics and Communication Conference and Australian Conference on Optical Fibre Technology, 2014, pp. 243-244.
Ref. 4: B. Steindl, R. Enne, S. Schidl, and H. Zimmermann, "Linear mode avalanche photodiode with high responsivity integrated in high-voltage CMOS," IEEE Electron Device Letters, vol. 35, no. 9, pp. 897-899, 2014, doi: 10.1109/LED.2014.2336678.
Ref. 5: M.-J. Lee, "First CMOS silicon avalanche photodetectors with over 10- GHz bandwidth," IEEE Photonics Technology Letters, vol. 28, no. 3, pp. 276-279, 2016, doi: 10.1109/LPT.2015.2494847.
VB: breakdown voltage, λ: wavelength, $\delta_{Si}$: silicon absorption depth (at given wavelength), R: overall responsivity (at given bandwidth; includes $M_{ph}$).
The figure of merit (FOM) is the R-bandwidth product normalized by the material absorption at the given wavelength.
$^a$Interpolated from data in M. A. Green, "Self-consistent optical parameters of intrinsic silicon at 300 K including temperature coefficients," Solar Energy Materials and Solar Cells, vol. 92, no. 11, pp. 1305-1310, 2008, doi: 10.1016/j.solmat.2008.06.009.
$_b$Isolated p-well architecture with STI-based guard-ring.
$^c$ Estimated from FIG. 6 in Ref. 3.
d Utilized a high-voltage (HV) CMOS platform to implement a thick depletion region. AR-coating included.

It is to be understood that the embodiments and claims disclosed herein are not limited in their application to the details of construction and arrangement of the components set forth in the description and illustrated in the drawings. Rather, the description and the drawings provide examples of the embodiments envisioned. The embodiments and claims disclosed herein are further capable of other embodiments and of being practiced and carried out in various ways. Also, it is to be understood that the phraseology and terminology employed herein are for the purposes of description and should not be regarded as limiting the claims.

Accordingly, those skilled in the art will appreciate that the conception upon which the application and claims are based may be readily utilized as a basis for the design of other structures, methods, and systems for carrying out the several purposes of the embodiments and claims presented in this application. It is important, therefore, that the claims be regarded as including such equivalent constructions.

Furthermore, the purpose of the foregoing Abstract is to enable the United States Patent and Trademark Office and the public generally, and especially including the practitioners in the art who are not familiar with patent and legal terms or phraseology, to determine quickly from a cursory inspection the nature and essence of the technical disclosure of the application. The Abstract is neither intended to define the claims of the application, nor is it intended to be limiting to the scope of the claims in any way.

What is claimed is:

1. An avalanche photodiode comprising:
a p-doped substrate;
a first n-doped region positioned above at least a portion of the p-doped substrate;
an n-doped epitaxial region positioned above at least a portion of the first n-doped region;
a plurality of n-doped wells positioned within the n-doped epitaxial region; and
a first p-doped region positioned above the n-doped epitaxial region and the plurality of n-doped wells;
wherein at least one of:
the first p-doped region has a higher doping concentration than the p-doped substrate;
the first p-doped region comprises SiGe; or
the p-doped substrate, the first n-doped region, the n-doped epitaxial region, and the plurality of n-doped wells each comprise silicon and the first p-doped region comprises SiGe.

2. The avalanche photodiode of claim 1, wherein at least one of:
the p-doped substrate is a p-doped silicon substrate;
the first p-doped region forms an anode of the avalanche photodiode;
the first n-doped region forms at least a portion of a cathode of the photodiode;
the first n-doped region has a higher doping concentration than a doping concentration of the n-doped epitaxial region; or
the first n-doped region has a higher doping concentration than a doping concentration of the plurality of n-doped wells.

3. The avalanche photodiode of claim 1, wherein at least one of:
the plurality of n-doped wells extend along a length of the n-doped epitaxial region; or
the avalanche photodiode achieves a maximum responsivity-bandwidth product of 25-35 A/W×MHz at wavelengths between 1000-1100 nm.

4. The avalanche photodiode of claim 1, wherein the first n-doped region, the n-doped epitaxial region, the plurality of n-doped wells, and the first p-doped region have a combined thickness of less than 2 microns.

5. An avalanche photodiode comprising:
a p-doped substrate;
a first n-doped region positioned above at least a portion of the p-doped substrate;
an n-doped epitaxial region positioned above at least a portion of the first n-doped region;
a plurality of n-doped wells positioned within the n-doped epitaxial region;
a first p-doped region positioned above the n-doped epitaxial region and the plurality of n-doped wells; and
a plurality of shallow trench isolations positioned beneath the first p-doped region and extending into at least a portion of n-doped epitaxial region.

6. The avalanche photodiode of claim 5, wherein at least one of:
the p-doped substrate is a p-doped silicon substrate;
the first p-doped region forms an anode of the avalanche photodiode;
the first n-doped region forms at least a portion of a cathode of the photodiode;
the first n-doped region has a higher doping concentration than a doping concentration of the n-doped epitaxial region; or
the first n-doped region has a higher doping concentration than a doping concentration of the plurality of n-doped wells.

7. The avalanche photodiode of claim 5, wherein at least one of:
the first p-doped region has a higher doping concentration than the p-doped substrate;
the first p-doped region comprises SiGe; or
the first p-doped region forms an anode of the avalanche photodiode.

8. The avalanche photodiode of claim 5, wherein at least one of:
the plurality of n-doped wells extend along a length of the n-doped epitaxial region; or
the avalanche photodiode achieves a maximum responsivity-bandwidth product of 25-35 A/W×MHz at wavelengths between 1000-1100 nm.

9. The avalanche photodiode of claim 5, wherein the p-doped substrate, the first n-doped region, the n-doped epitaxial region, and the plurality of n-doped wells each comprise silicon and the first p-doped region comprises SiGe.

10. The avalanche photodiode of claim 5 further comprising:
a second p-doped region positioned above at least a portion of the p-doped substrate;
wherein the second p-doped region extends around a perimeter of at least a portion of the n-doped region and the n-doped epitaxial region.

11. The avalanche photodiode of claim 10, wherein at least one of:
the second p-doped region has a higher doping concentration than a doping concentration of the p-doped substrate; or
the second p-doped region has a higher doping concentration than a doping concentration of the first p-doped region.

12. The avalanche photodiode of claim 5, wherein the n-doped region, the n-doped epitaxial region, the plurality of n-doped wells, and the first p-doped region have a combined thickness of less than 2 microns.

13. An avalanche photodiode comprising:

a p-doped substrate;

a first n-doped region positioned above at least a portion of the p-doped substrate;

an n-doped epitaxial region positioned above at least a portion of the first n-doped region;

a plurality of n-doped wells positioned within the n-doped epitaxial region;

a first p-doped region positioned above the n-doped epitaxial region and the plurality of n-doped wells; and a second p-doped region positioned above at least a portion of the p-doped substrate;

wherein the second p-doped region extends around a perimeter of at least a portion of the first n-doped region and the n-doped epitaxial region.

14. The avalanche photodiode of claim 13, wherein at least one of:

the second p-doped region has a higher doping concentration than a doping concentration of the p-doped substrate; or the second p-doped region has a higher doping concentration than a doping concentration of the first p-doped region.

15. The avalanche photodiode of claim 13 further comprising:

a second n-doped region positioned above at least a portion of the first n-doped region;

wherein:

the second n-doped region extends around a perimeter of at least a portion of the n-doped epitaxial region; and the second p-doped region extends around a perimeter of at least a portion of the second n-doped region.

16. The avalanche photodiode of claim 13 further comprising:

a third p-doped region positioned above at least a portion of the second p-doped region;

wherein the third p-doped region has a higher doping concentration than a doping concentration of the second p-doped region.

17. An avalanche photodiode comprising:

a p-doped silicon substrate;

an n-doped silicon region positioned above at least a portion of the p-doped silicon substrate and forming at least a portion of a cathode of the avalanche photodiode;

an n-doped epitaxial silicon region positioned above at least a portion of the first n-doped silicon region;

a plurality of n-doped silicon wells positioned within the n-doped epitaxial silicon region;

a p-doped silicon region positioned above the n-doped epitaxial silicon region and the plurality of n-doped silicon wells;

a plurality of shallow trench isolations positioned beneath the p-doped silicon region and extending into at least a portion of the n-doped epitaxial silicon region; and a p-doped SiGe region positioned above the n-doped epitaxial silicon region and the plurality of n-doped silicon wells and forming an anode of the avalanche photodiode;

wherein:

the n-doped silicon region has a higher doping concentration than a doping concentration of both the n-doped epitaxial silicon region and the plurality of n-doped silicon wells; and the p-doped SiGe region has a higher doping concentration than the p-doped silicon substrate.

18. The avalanche photodiode of claim 17, wherein the avalanche photodiode achieves a maximum responsivity-bandwidth product of 25-35 A/W×MHz at wavelengths between 1000-1100 nm.

19. The avalanche photodiode of claim 17, wherein the n-doped silicon region, the n-doped epitaxial silicon region, the plurality of n-doped silicon wells, and the p-doped silicon region have a combined thickness of less than 2 microns.

\* \* \* \* \*